US006841337B1

(12) United States Patent
Speakman

(10) Patent No.: US 6,841,337 B1
(45) Date of Patent: Jan. 11, 2005

(54) MASKING APPARATUS AND METHOD

(76) Inventor: Becki Speakman, 9512 Horton, Overland Park, KS (US) 66207

( * ) Notice: Subject to any disclaimer, the term of this patent is extended or adjusted under 35 U.S.C. 154(b) by 0 days.

(21) Appl. No.: 09/549,445

(22) Filed: Apr. 14, 2000

(51) Int. Cl.[7] .................................................. G03F 7/12

(52) U.S. Cl. ........................................ 430/308; 430/306

(58) Field of Search ................................. 430/306, 308, 430/5; 101/214, 215, 225, 219

(56) References Cited

U.S. PATENT DOCUMENTS

| | | | | |
|---|---|---|---|---|
| 2,651,871 A | | 9/1953 | Lynden | 427/265 |
| 3,855,924 A | | 12/1974 | Morse, Jr. | 101/129 |
| 4,397,261 A | | 8/1983 | Jones | 118/505 |
| 4,550,683 A | | 11/1985 | Jones | 118/505 |
| 5,460,087 A | | 10/1995 | Ogorzalek | 101/128.11 |
| 5,722,120 A | | 3/1998 | Bindschatel et al. | 16/250 |
| 5,873,375 A | | 2/1999 | Johnson et al. | 132/200 |
| 6,312,872 B1 | * | 11/2001 | Murphy et al. | 430/306 |

FOREIGN PATENT DOCUMENTS

| | | |
|---|---|---|
| DE | 3607739 | 9/1987 |
| WO | 8909862 | 10/1989 |

OTHER PUBLICATIONS

*Pottery Barn Kids*, Holiday 1999, pp. 49, 52, 73 (author unknown).

"All Glazed Over; using glaze in wall decoration," *Better Homes and Gardens*, Jan. 2000, p. 26 (author unknown).

"Decorating the Nursery," text by Heather Smith Macisual, photos by Minh & Wass, *Martha Stewart & Baby* (*Special Issue*), Mar. 2000, pp. 84–89.

* cited by examiner

*Primary Examiner*—Saleha R. Mohamedulla
(74) *Attorney, Agent, or Firm*—Sonnenschein Nath & Rosenthal LLP; Brian R. McGinley

(57) ABSTRACT

A masking apparatus and method includes a substrate fabricated to include a mask removable affixed to a backing. A plurality of designs may be formed in the apparatus by conventional methods. The mask may be cut into variable lengths and thereafter removably attached to a working surface. A transfer medium may be applied to the mask and the working surface to transfer both positive and negative images of the mask onto the working surface.

13 Claims, 3 Drawing Sheets

MASKING APPARATUS AND METHOD

BACKGROUND OF THE INVENTION

1. Field of the Invention

The present invention relates generally to stenciling apparatus and methods, and more particularly to an adhesive masking apparatus and method for creating stylized images on a working surface.

2. Background Art

Stenciling or otherwise placing designs onto surfaces in a home, office or other building is very popular. For example, it is common to stencil designs such as wild animals, clouds, stars and the like onto walls in a child's room.

A variety of stenciling apparatus and methods are known. Prior art stenciling devices are, however, often complex and difficult to use. The apparatus typically comprise a hand held or adhesive sheet-like device adapted for transferring a positive image of a single design onto a working surface. Such devices are not well-suited for creating designs that cover large working surfaces such as a wall or a ceiling without constant repositioning and alignment of the device. As such, it is common to apply large designs by freehand, which is unduly burdensome and often results in a non-uniform application of the designs onto the working surface. Examples of such large designs applied by freehand are illustrated in the following periodicals: Holiday 1999 *pottery barn kids*; the January 2000 *Better Homes and Gardens*; and the March, 2000 *Martha Stewart Baby* (special issue).

As indicated above, a number of prior art stenciling apparatus are useful for creating single designs, or for creating a multiple designs "one-at-a-time" by repositioning the apparatus. For example, U.S. Pat. No. 4,550,683 discloses an apparatus that includes a three-layer adhesive sheet adapted to be secured to a work surface for placing a predetermined design thereupon. The construction includes a relatively strong contact adhesive which allows the apparatus to function as a decal or as a stencil when applied to a working surface. In operation, in order to create a design a user must remove a plurality of score lines from the apparatus to define a predetermined design to be transferred to the working surface. The patent discloses the use of a strong adhesive such that the apparatus can be used as a decal, and thus, the apparatus may be difficult to remove from the working surface and is not well adapted for repositioning therealong to transfer designs onto large surfaces.

Another example is disclosed in U.S. Pat. No. 4,397,261. U.S. Pat. No. 4,397,261 discloses a paint mask and method for masking a work surface wherein the mask is comprised of a first mask layer and a second liner layer. A face of the first layer includes strong adhesive coating with the second layer being adhesively secured thereto. A predetermined design configuration is formed in the mask by discontinuous cuts extending through both the first and second layers. Thus, like the '683 patent, a user must remove portions of the mask to define the design to be applied to the working area. The '261 apparatus is also not well adapted for repositioning or transferring designs onto a large surface due to the use a relatively strong adhesive.

U.S. Pat. No. 3,855,924 and U.S. Pat. No. 2,651,871 disclose further prior art stenciling apparatus. These hand held apparatus include a surface having a plurality of cut out portions or openings forming a design. These apparatus are not adhesive backed and must be held in position during use.

The apparatus are positioned immediately adjacent a working surface whereupon paint is applied to the working surface through the apparatus openings. Like other prior art devices, to repeat a design over large surfaces, the apparatus must be repositioned in alignment with the previously applied design.

SUMMARY OF THE INVENTION

The above problems are solved, and a number of technical advances are achieved in the art, by implementation of the novel masking apparatus and method of the present invention.

The apparatus, which may be formed from conventional repositioning paper or the like, includes a first layer or mask, and a second layer or backing. The mask includes an outer surface and an inner surface having a low-tack adhesive uniformly applied thereupon. The supportive backing includes an outer surface and an inner surface. The mask is fabricated to be removably affixed to the backing by positioning the mask's inner surface in face-to-face relation with the backing's outer surface.

A plurality of preselected designs are selectively fabricated on the apparatus, for example by cutting through the mask and the backing to form a positive image of the design therein.

The masking apparatus is preferably fabricated into rolls for ease of storage and convenient dispensing therefrom. In operation, a user may select an appropriate size of the masking apparatus, for example an amount sufficient to a cover a predetermined distance along a working surface such as a wall. Next, the user separates the mask from the backing. Thereafter, the mask is removably attached to the working surface such that the mask covers or blocks out at least a portion of the working surface. The user may selectively cover a small portion or a correspondingly large potion of the working surface. A transfer medium such as paint is then applied to the working surface and the mask to transfer an image of the mask onto the working surface.

The present invention overcomes many of the problems associated with the prior art. The use of precut designs allows for ease in operation. Moreover, a single design or series of designs may be fabricated into the apparatus along the length thereof in uniform alignment. The masking apparatus may be selectively dispensed from the roll to cover both small and large working surfaces. The apparatus uses a low tack adhesive for ease in repositioning about the working surface or for removal therefrom. The apparatus uses precut designs which eliminates the need for removing scoring lines in operation. As discussed more below, the apparatus may also be used to create positive and negative images onto the working surfaces.

Other objects and advantages will become apparent from the specification together with the drawings, wherein specific embodiments of the present invention are set forth by way of example.

DESCRIPTION OF THE PREFERRED EMBODIMENTS

Figure 1:
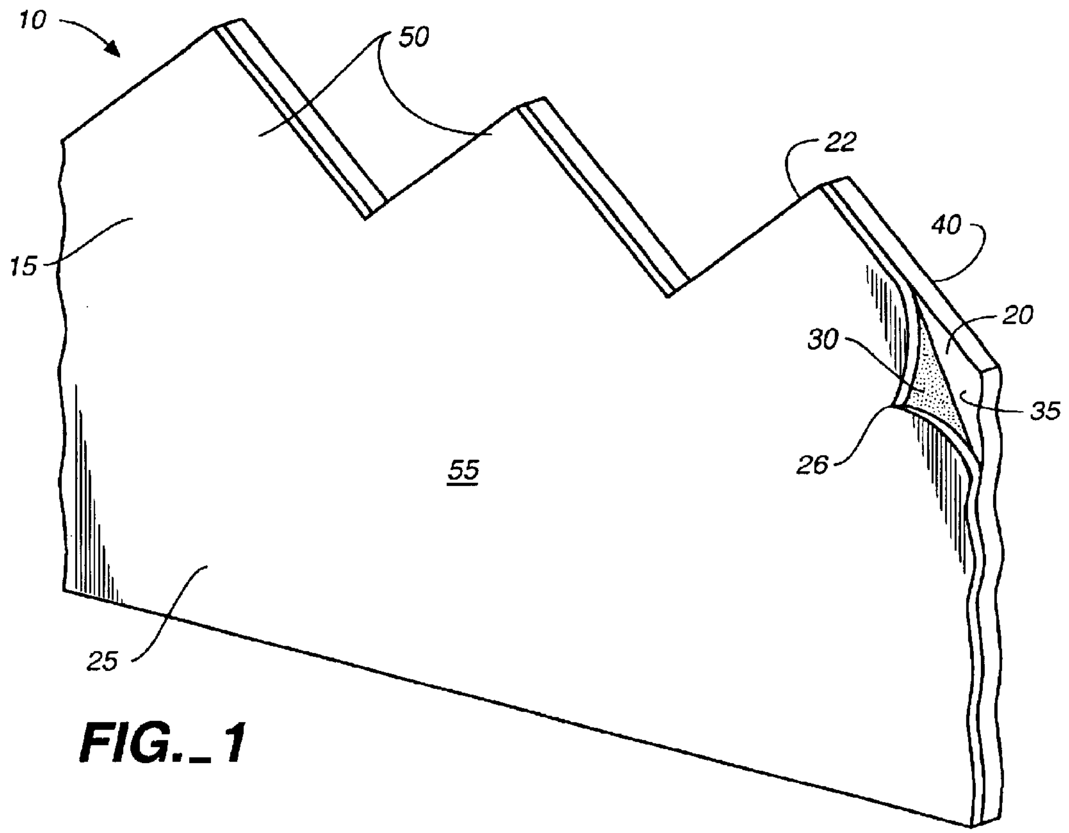
FIG. 1 is a fragmentary perspective view of a masking apparatus embodying the present invention showing a mask and a backing thereof, with a portion of the backing pulled away from the mask.

Referring to FIG. 1 in greater detail, the reference number 10 refers to a masking apparatus exemplifying the present invention. The masking apparatus 10 comprises a patterned or stylized substrate, such as repositioning paper, having a first layer or mask 15 and a second layer or backing 20. The mask 15 may be constructed from most conventional types of decal or masking materials, and includes a mask outer perimeter 22, a mask outer surface 25, and a mask inner surface 30. Referring to FIG. 1, the mask inner surface 30 is illustrated by a turned back corner 26 of the mask 15, and is uniformly covered with a low-tack adhesive.

The backing 20 provides a protective liner or support for the mask 15 such that the mask 15 may be removably affixed thereto. The backing 20 includes an outer surface 35 and an inner surface 40. The backing 20 may also be constructed from conventional masking materials. Typically, the backing 20 comprises an adhesion resistant material such that when the backing outer surface 35 is disposed in face-to-face relation with the mask inner surface 30, it will readily allow separation of the mask from the backing upon the application of an appropriate force.

A plurality of designs such as spikes 50 may be formed along the perimeter 22 of the mask 15 by kiss-cutting or die-cutting the mask and backing 15, 20 or by other well-known methods. The designs may similarly be formed in any other region of the mask 15, such as within an interior portion 55, by similar well-known methods. The designs may be arranged in any of a number of manners, such as to form a design pattern comprising a plurality of designs. For example, the designs may precut and arranged such in series with other designs along a length of the mask 15, or symmetrically with respect to other designs about the mask 15. A design may also appear continuously or repeatedly thoughout the mask 15. For example, waves (not shown) may be formed along upper and lower edges of the mask 15.

Figure 5:
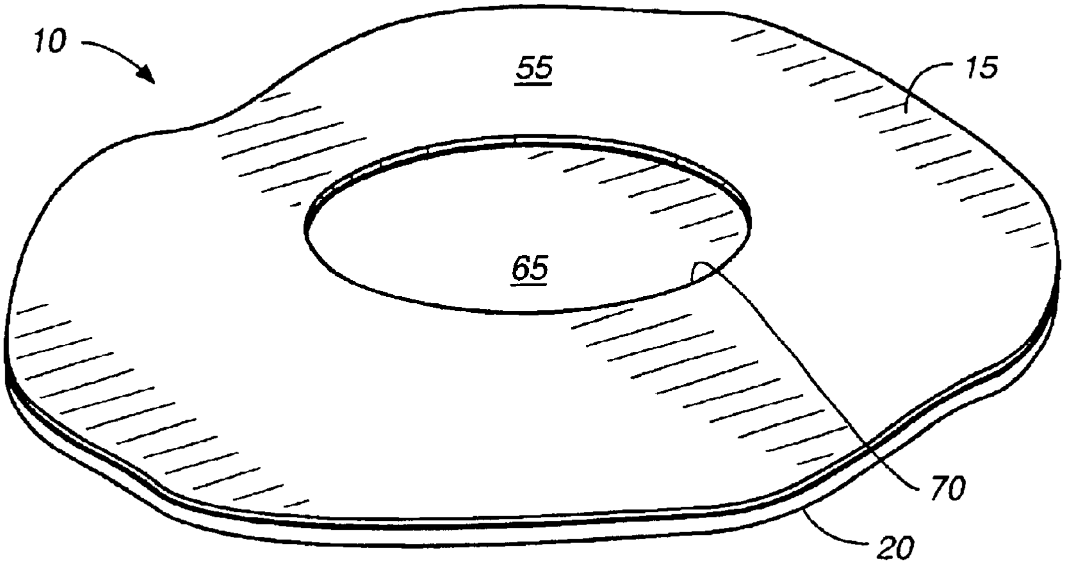
FIG. 5 is a broken away perspective view of the apparatus of the present invention showing the mask attached to a full or continuous backing.

The designs may be formed by cutting the mask 15 prior to joining it with the backing 20, or subsequent to joining it with the backing 20. When the mask 15 is cut prior to joining it with the backing 20, the backing 20 provides additional support and protection to the mask 15 and the designs. For example, FIG. 5 shows a design comprising an opening 70 formed within the interior portion 55 of the mask 15. A continuous backing portion 65 is visible through the opening 70. It may also be advantageous to provide the continuous backing 65 for increased strength when the apparatus 10 is fabricated into a roll 72 as discussed more below. Alternatively, as discussed above, the designs may be formed by cutting away corresponding portions of the mask 15 and the backing 20 after they have been joined together.

Figure 3:
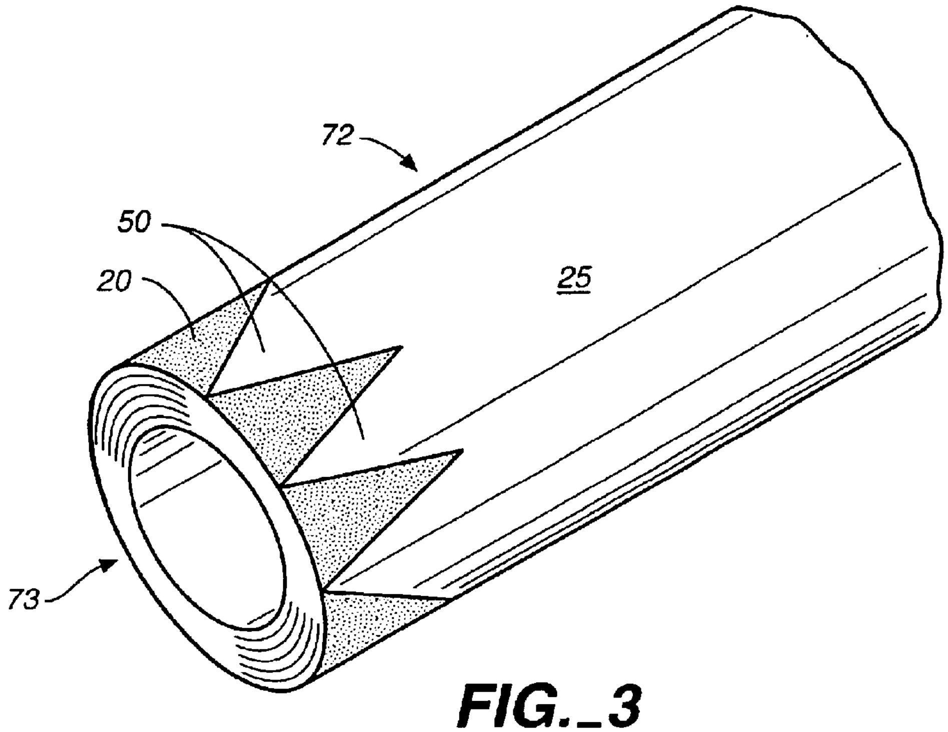
FIG. 3 is a broken away perspective view of an end of a roll of the masking apparatus in accordance with the present invention.

As shown in FIG. 3, the masking apparatus 10 is preferably packaged as rolls 72 of variable lengths and widths. FIG. 3 illustrates a broken away end 73 of the roll 72 having the spikes 50 disposed at the end 73 of the roll 72. Of course, the designs generally may be disposed in any convenient orientation respecting the roll 72. The use of rolls 72 facilitates dispensing of the apparatus 10 in variable lengths. Thus, the user may selectively provide a sufficient measure of the mask 15 to cover some or all of the working surface with a single continuous length of the mask 15.

Figure 2:
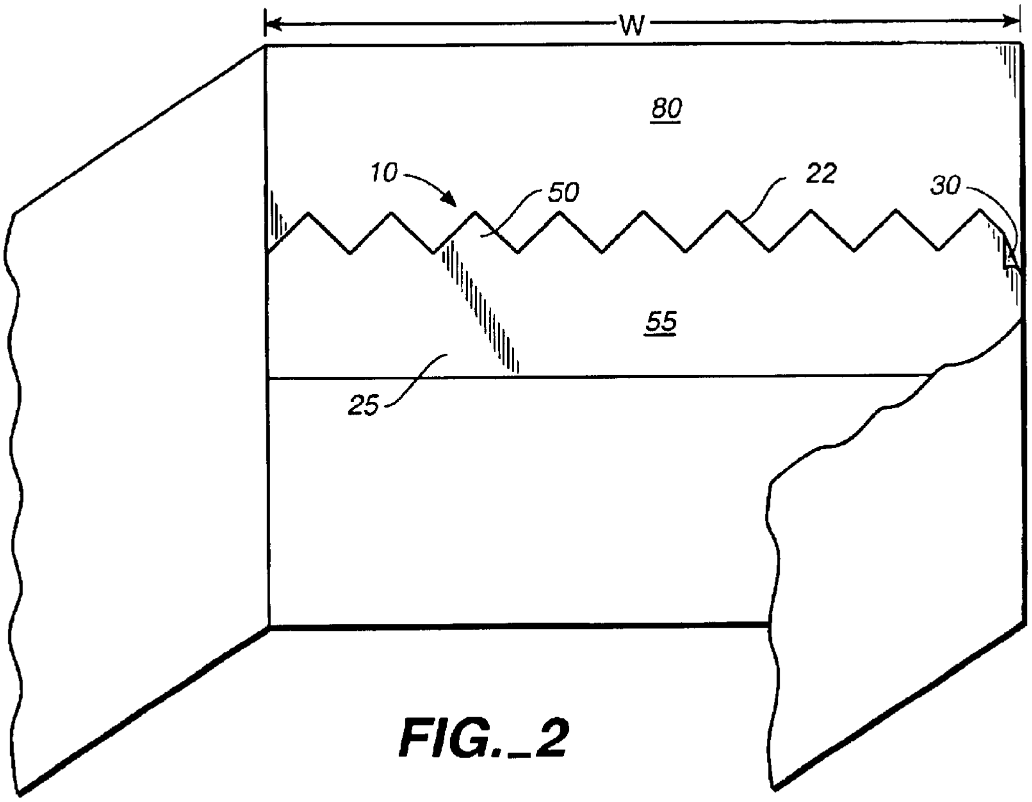
FIG. 2 is a perspective view of the masking apparatus of FIG. 1, showing the apparatus substantially attached to a work surface.
Figure 4:
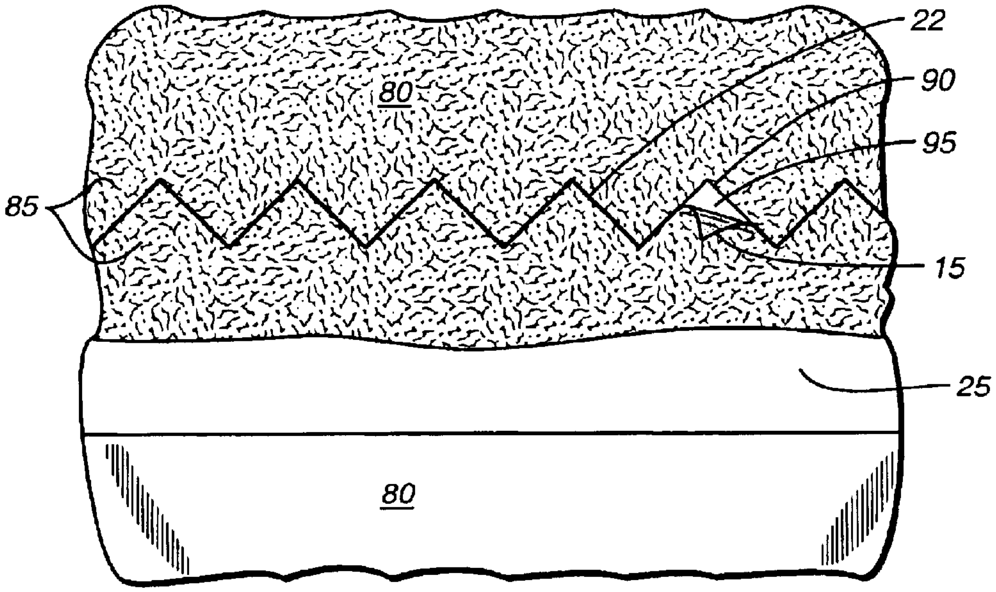
FIG. 4 is a front elevational view of the masking apparatus of FIG. 2, showing the working surface after paint has been applied thereto in accordance with the apparatus and method of the present invention.

In operation, the masking apparatus 10 is adapted to be removably secured to the working surface, such as an interior wall 80 as shown in FIGS. 2 and 4. For example, a user may measure the width of the wall 80 as shown by dimension W in FIG. 2. The user may then provide a corresponding length of masking apparatus 10 by unrolling the roll 72 and cutting the apparatus 10 accordingly.

The user then removes the backing 20 from the mask 15 to expose the adhesive inner surface 30 of the mask 15. Next, the mask 15 is affixed to the wall 80 by disposing the mask inner surface 30 in face-to-face relation thereto. For example, FIG. 4 shows the mask 15 attached to the wall 80 along a central portion thereof and extending the entire dimension W thereof. Of course, the mask 15 need not extend the entire length of the dimension W.

Referring to FIG. 4, an interface 90 is defined between the mask 15 and the wall 80 at the junction of the outer perimeter 22 and the wall 80. After the mask 15 is attached to the wall 80, the user may apply a transfer medium such as one or more coats of paint 85 directly onto the wall 80 and the mask 15 adjacent the interface 90. As shown in FIG. 4, an image of the mask 15 is created on the wall 80 by the application of the paint 85 thereto. Of course, if the masking apparatus includes one or more designs within the interior 55, the transfer medium should also be applied thereupon to transfer an image of the design onto the working surface. After allowing a sufficient amount of drying time for the paint 85, the mask 15 may be easily removed from the wall 80 by peeling.

Referring to FIG. 4 and FIG. 5, it is readily apparent that the masking apparatus 10 may be used to create both positive and negative images on the working surface. For example, referring to FIG. 4, the user may apply paint 85 onto the mask 15 and the wall 80 in proximity to the interface 90. A negative image of the mask is thereby transferred to the wall, as shown at 95 in FIG. 4, because the mask 15 prevents the paint 85 from contacting the wall 80 beneath the mask 15. Conversely, the apparatus 10 may also be used to create positive images of the designs on the working surface. For example, referring to FIG. 5, the user may apply a transfer medium onto the opening 70 in the interior portion 55 in the same manner described above, thereby transferring a positive image of the opening 70 onto the working surface.

Figure 6:
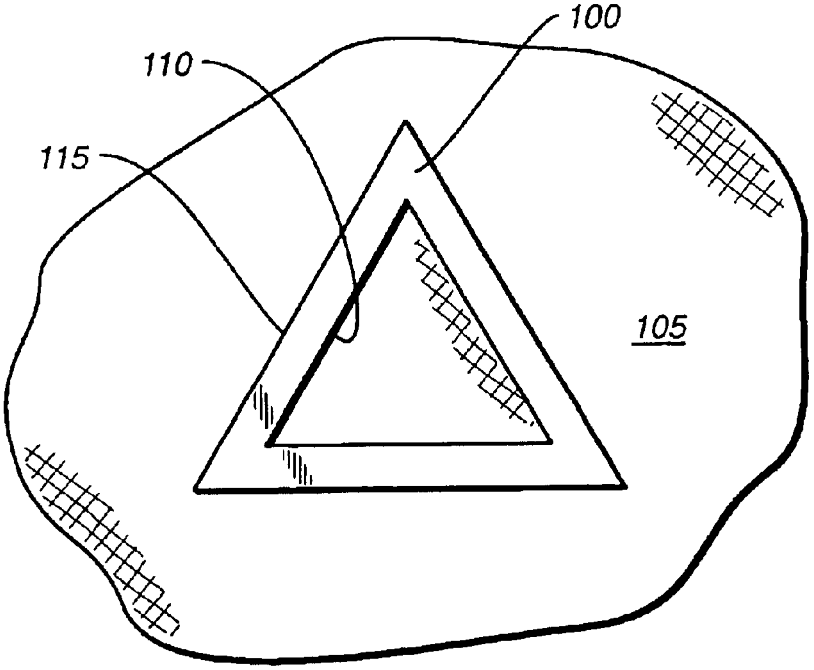
FIG. 6 is a broken away front elevational view of a first modified embodiment of the present invention showing the apparatus used as a template device on a piece of fabric.

In an alternative embodiment, the apparatus 10 may be utilized as a template device. For example, FIG. 6 shows a triangle design 100 formed from the apparatus 10. The triangle 100 is attached to a working surface such as fabric 105 in a manner similar to that described above. A user may then trace with a marking device, such as a felt pin, around the inner and outer perimeter 110, 115 of the triangle to transfer a positive image of the triangle 100 onto the fabric 105. Similarly, the user may use a cutting device such as scissors to cut around the perimeters 110, 115 to produce a positive replica of the triangle from the fabric 105.

While it is believed that the method of using the masking apparatus 10 of the present invention to transfer an image of a design onto a working surface is apparent from the foregoing description, for the sake of clarity, the method will now be described. In its broadest aspect, the method in accordance with the present invention comprises four steps: providing a stylized masking apparatus; attaching the mask to a working surface to form an interface between the mask and the working surface; applying a transfer medium to the working surface in proximity to the interface to transfer an image of the mask onto the working surface; and removing the mask from the working surface.

It is foreseen that the present invention can be used in the manners described herein in connection with a variety of working surfaces, including, for example, wood, glass, fabric, metal, concrete, terra cotta, plaster, ceramics, plastics, candles, canvas, paper crafts such as cards, stationery, gift bags, envelopes.

It is also foreseen that the present invention can be used in connection with a variety of transfer mediums, including, for example, flat paint, satin paint, matte paint, semi gloss paint, hi gloss paint, interior and exterior paints, acrylic paint, Krylon® spray paints, Delta® perm enamel, Pebeo™ glass paint, fabric paints, fabric markers, fabric crayons, metal paints, outdoor paints, ceramic glazes, ceramic markers, ceramic pens, ceramic paints, candle paint mediums, oil paints, stamp ink, markers, embossing powders, pens, pencils, chalk, scissors, razors, knifes and the like.

It should be recognized that there are many options regarding how and where to place the various interfaces and the variations should not limit the spirit or intent of the present invention. It should be further recognized that any of the known technologies utilized for stenciling apparatus and methods may be incorporated within the present invention.

The foregoing description of the embodiments of the invention has been presented for purposes of illustration and description, and is not intended to be exhaustive or to limit the invention to the precise form disclosed. The description was selected to best explain the principles of the invention and practical application of these principles to enable others skilled in the art to best utilize the invention in various embodiments and modifications as are suited to the particular use contemplated. It is intended that the scope of the invention not be limited by the specification, but be defined by the claims set forth below.

What is claimed is:

1. A masking apparatus for transferring images to a working surface, comprising:

(a) a mask formed from a unitary and continuous substrate, the mask having an outer surface and an inner surface; said inner surface having an adhesive disposed thereon;

(b) a backing removably affixed to said mask at said inner surface;

(c) a plurality of designs formed in said mask;

(d) said mask adapted to be removably attached to said working surface at said inner surface;

(e) wherein said mask is configured to be selectively and continuously dispensable in a generally longitudinal direction along the working surface, and to be removably, affixedly adhered along a predetermined distance of the working surface, said predetermined distance along the working surface being one of a portion of the working surface or the entire working surface such that said image can be transferred to the working surface along the entire predetermined distance without having to reposition the mask; and (f) wherein said images that are transferred to the working surface comprise both a positive and a negative image of the mask.

2. The apparatus of claim 1, wherein said plurality of designs repeat along at least a portion of said mask to form a design pattern.

3. The apparatus of claim 1 wherein said apparatus is fabricated into a roll.

4. A masking apparatus for transferring an image to a working surface, comprising:

(a) a mask formed from a unitary and continuous substrate, the mask having an outer surface and an inner surface; said inner surface having an adhesive disposed thereon and a backing removably affixed to said mask at said inner surface;

(b) said mask having a plurality of precut designs; said designs generally repeat along at least a portion of said mask to form a design pattern; and (c) said mask adapted to be removably attached to said working surface at said inner surface;

(d) wherein said mask is configured to be selectively and continuously dispensable in a generally longitudinal direction along the working surface, and to be removably, affixedly adhered along a predetermined distance of the working surface, said predetermined distance along the working surface being one of a portion of the working surface or the entire working surface, such that said image can be transferred to the working surface along the entire predetermined distance without having to reposition the mask; and (e) wherein said image that is transferred to the working surface comprises both a positive and a negative image of the mask.

5. Th appartatus of claim 4 wherein said apparatus is fabricated into a roll.

6. A method to transfer an image to a working surface; said method comprising:

(a) providing a stylized masking apparatus; said masking apparatus including a mask and a backing removably affixed to said mask; said masking apparatus including a plurality of designs formed along at least a portion of said mask;

(b) selectively dispensing said mask to continuously cover a predetermined portion of said working surface;

(c) attaching said mask to a working surface to form an interface between said designs and said working surface;

(d) applying a transfer medium to the working surface in proximity to the interface to transfer both a positive and a negative image of at least a portion of said mask onto said working surface.

7. The masking apparatus of claim 4 wherein said mask is initially assembled in a roll.

8. The masking apparatus of claim 4 wherein said substrate is formed from a low tack adhesive paper.

9. The masking apparatus of claim 1 wherein said working surface is at least one of a wall, wood, glass, fabric, metal, concrete, terra cotta, plaster, ceramics, stationery, a gift bag, and an envelope.

10. The masking apparatus of claim 4 wherein said working surface is at least one of a wall, wood, glass, fabric, metal, concrete, terra cotta, plaster, ceramics, stationery, a gift bag, and an envelope.

11. The masking apparatus of claim 1 wherein said image is transferred by application of a transfer medium comprising at least one of flat paint, satin paint, matte paint, semi gloss paint, hi gloss paint, interior and exterior paint, acrylic paint, Krylon® spray paint, Delta® perm enamel, Pebeo™ glass paint, fabric paint, fabric marker, fabric crayon, metal paint, outdoor paint, ceramic glaze, ceramic marker, ceramic pen, ceramic paint, candle paint media, oil paint, stamp ink, a marker, embossing powder, a pen, a pencil, chalk, scissors, a razor, or a knife.

12. The masking apparatus of claim 4 wherein said image is transferred to said working surface by application of a transfer medium comprising at least one of flat paint, satin paint, matte paint, semi gloss paint, hi gloss paint, interior and exterior paint, acrylic paint, Krylon® spray paint, Delta® perm enamel, Pebeo™ glass paint, fabric paint, fabric marker, fabric crayon, metal paint, outdoor paint, ceramic glaze, ceramic marker, ceramic pen, ceramic paint, candle paint media, oil paint, stamp ink, a marker, embossing powder, a pen, a pencil, chalk, scissors, a razor, or a knife.

13. A masking apparatus for transferring an image to a working surface, comprising:

(a) a first portion having a first design for transferring a positive image of the first design to the working surface; and (b) a second portion having a second design for transferring a negative image of the second design to the working surface.

* * * * *